United States Patent
Lu et al.

(10) Patent No.: US 11,909,399 B2
(45) Date of Patent: Feb. 20, 2024

(54) SYSTEM AND SEMICONDUCTOR DEVICE THEREIN

(71) Applicant: TAIWAN SEMICONDUCTOR MANUFACTURING COMPANY, LTD., Hsinchu (TW)

(72) Inventors: Tsung-Che Lu, Tainan (TW); Chin-Ming Fu, Hsinchu County (TW); Chih-Hsien Chang, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/828,834

(22) Filed: May 31, 2022

(65) Prior Publication Data

US 2023/0387897 A1 Nov. 30, 2023

(51) Int. Cl.
| | | |
|---|---|---|
| *H03K 5/00* | (2006.01) | |
| *H03K 5/01* | (2006.01) | |
| *H03K 3/037* | (2006.01) | |
| *G06F 1/06* | (2006.01) | |
| *H03K 19/20* | (2006.01) | |

(52) U.S. Cl.
CPC ............... *H03K 5/01* (2013.01); *G06F 1/06* (2013.01); *H03K 3/037* (2013.01); *H03K 19/20* (2013.01); *H03K 2005/00013* (2013.01)

(58) Field of Classification Search
CPC .......... H03K 5/01; H03K 3/037; H03K 19/20; H03K 2005/00013; G06F 1/06
USPC ........................................................ 327/199
See application file for complete search history.

(56) References Cited

U.S. PATENT DOCUMENTS

| | | | | |
|---|---|---|---|---|
| 6,492,852 | B2 * | 12/2002 | Fiscus ................... | G11C 7/222 327/158 |
| 6,946,872 | B1 * | 9/2005 | Pan .................. | H03K 19/17744 326/46 |
| 7,167,023 | B1 * | 1/2007 | Pan .................. | H03K 19/17744 326/47 |
| 7,200,769 | B1 * | 4/2007 | Chong ................. | H03L 7/0805 713/600 |
| 7,231,536 | B1 * | 6/2007 | Chong ................. | H03L 7/0816 713/400 |
| 7,234,069 | B1 * | 6/2007 | Johnson ............... | H03L 7/0816 713/400 |
| 8,575,957 | B2 * | 11/2013 | Pan ................ | H03K 19/017581 327/158 |
| 9,166,589 | B2 * | 10/2015 | Pan .................. | H03K 19/17744 |
| 9,596,037 | B2 * | 3/2017 | Hsueh .................. | H04B 17/345 |
| 9,614,534 | B1 * | 4/2017 | Shi ........................ | H03L 7/0814 |
| 10,079,648 | B2 * | 9/2018 | Hsueh ............. | G01R 31/31709 |

(Continued)

*Primary Examiner* — Ryan Jager
(74) *Attorney, Agent, or Firm* — Birch, Stewart, Kolasch & Birch, LLP

(57) ABSTRACT

A system includes a measuring device, a processing device and a signal generating device. The measuring device is configured to measure a voltage difference between a first node and a second node. The processing device is coupled between the first node and the second node. The signal generating device is configured to provide a first clock signal to the processing device to adjust the voltage difference, configured to generate the first clock signal according to a first enable signal and a second clock signal, and configured to align an edge of the first enable signal with an edge of the second clock signal. A method and a device are also disclosed herein.

20 Claims, 12 Drawing Sheets

(56) References Cited

U.S. PATENT DOCUMENTS

| | | | |
|---|---|---|---|
| 10,203,749 B2* | 2/2019 | Li | G06F 1/3206 |
| 10,560,075 B1* | 2/2020 | Iorga | G01R 27/32 |
| 10,775,831 B1* | 9/2020 | Kamiya | H03L 7/16 |
| 10,979,057 B1* | 4/2021 | Sun | H03L 7/091 |
| 11,218,151 B2* | 1/2022 | Choi | H03L 7/0814 |
| 2008/0165608 A1* | 7/2008 | Choi | G11C 5/145 |
| | | | 365/228 |
| 2013/0049820 A1* | 2/2013 | Ide | H03K 21/12 |
| | | | 327/115 |
| 2013/0335043 A1* | 12/2013 | He | H02M 3/08 |
| | | | 323/234 |
| 2014/0300191 A1* | 10/2014 | Matsubara | G06F 1/26 |
| | | | 307/43 |
| 2014/0361819 A1* | 12/2014 | Lundberg | G06F 1/3296 |
| | | | 327/198 |
| 2014/0361828 A1* | 12/2014 | Lundberg | H03K 19/0008 |
| | | | 327/543 |
| 2016/0182063 A1* | 6/2016 | Seo | G11C 7/22 |
| | | | 327/149 |
| 2017/0250694 A1* | 8/2017 | Im | H03L 7/0812 |
| 2019/0272306 A1* | 9/2019 | Howald | G06F 30/367 |
| 2023/0028479 A1* | 1/2023 | Lu | G06F 30/3953 |

\* cited by examiner

SYSTEM AND SEMICONDUCTOR DEVICE THEREIN

BACKGROUND

A power delivery network transforms input voltage signals between various power domains to generate reference voltage signals. The reference voltage signals provide electric power to various devices for operations. A measurement to an impedance of the power delivery network is performed with a current sink. The current sink occupies large on-chip area and may induce a leakage current.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
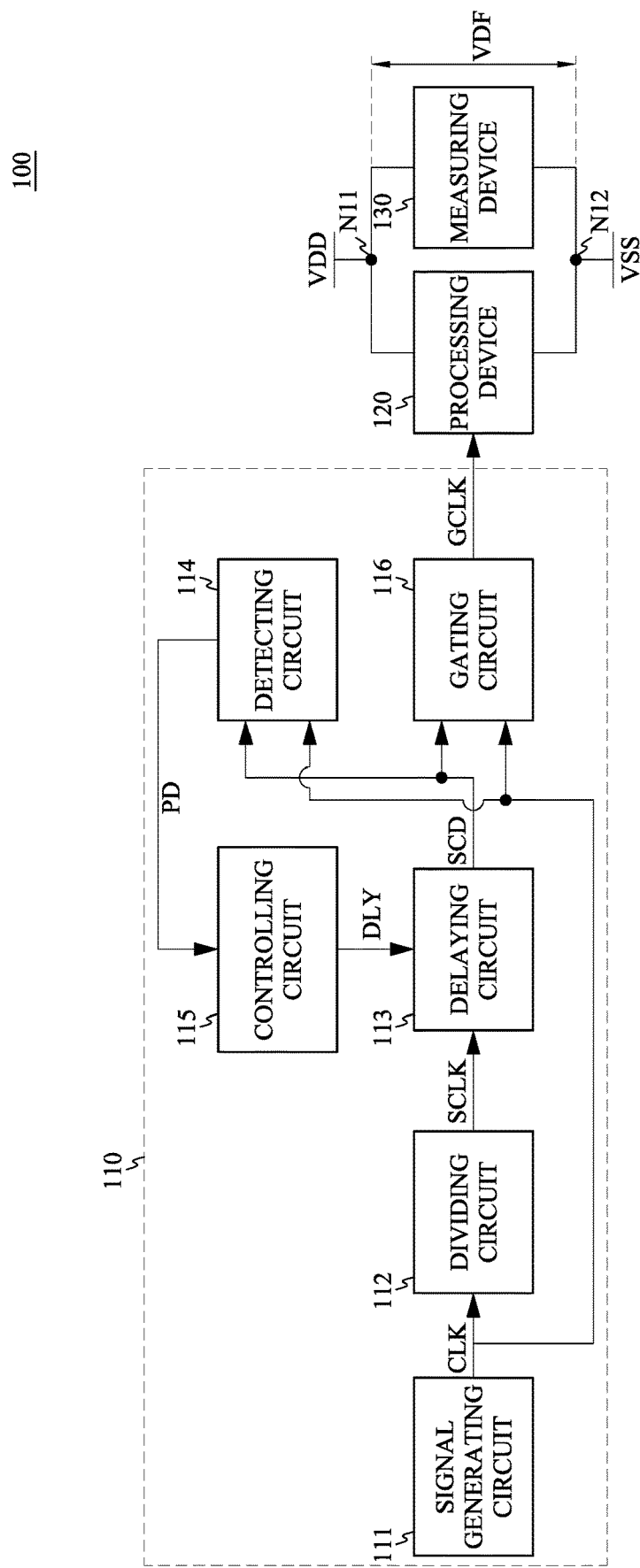
FIG. 1 is a schematic diagram of a system in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

FIG. 1 is a schematic diagram of a system 100 in accordance with some embodiments of the present disclosure. In some embodiments, the system 100 includes a signal generating device 110, a processing device 120 and a measuring device 130. As illustratively shown in FIG. 1, the processing device 120 is configured to receive a reference voltage signal VDD at a node N11 and receive a reference voltage signal VSS at a node N12 to operate. The measuring device 130 is coupled to the nodes N11 and N12, and configured to measure a voltage difference VDF between the nodes N11 and N12, to extract an impedance of a power delivery network (not shown in FIG. 1) which is configured to provide the reference voltage signals VSS and VDD. The signal generating device 110 is configured to apply a gated clock signal GCLK to the processing device 120 to adjust the voltage difference VDF.

In some embodiments, the processing device 120 is implemented by a central processing unit (CPU), a high-performance computing (HPC) device, or other suitable device. In some embodiments, the measuring device 130 is implemented by an on-chip probe, an edge detector, or other suitable device.

In some embodiments, the signal generating device 110 includes a signal generating circuit 111, a dividing circuit 112, a delaying circuit 113, a detecting circuit 114, a controlling circuit 115 and a gating circuit 116.

As illustratively shown in FIG. 1, the signal generating circuit 111 is configured to generate a clock signal CLK. The dividing circuit 112 is configured to receive the clock signal CLK, and divide a frequency of the clock signal CLK to generate an enable signal SCLK. The delaying circuit 113 is configured to delay the enable signal SCLK to generate an enable signal SCD. The detecting circuit 114 is configured to generate a feedback signal PD according to the clock signal CLK and the enable signal SCD. The controlling circuit 115 is configured to generate a controlling signal DLY according to the feedback signal PD, to control the delaying circuit 113. The gating circuit 116 is configured to generate the gated clock signal GCLK according to the clock signal CLK and the enable signal SCD.

In some embodiments, the signal generating circuit 111 is implemented by a phase locked loop circuit. The dividing circuit 112 is implemented by a divider. The delaying circuit 113 is implemented by a digital controlled delay line. The detecting circuit 114 is implemented by a phase detector. The controlling circuit 115 is implemented by a processor. The gating circuit 116 is implemented by an isolation clock gating circuit.

In various embodiments, the gated clock signal GCLK is applied to various devices, such as devices and systems which need accurate start-up timing, devices which need to operate at a specific timing region, devices which need to be powered on or powered off for strict timing requirement without large uncertainty, and systems which need to start at a certain time point, such as a rocket launch system.

Figures 2A, 2B:
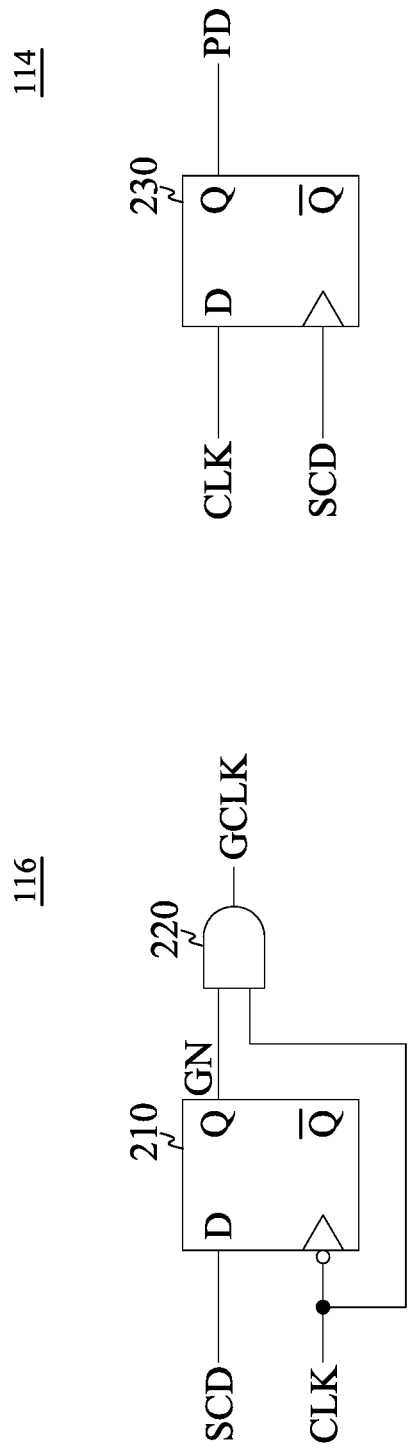
FIG. 2A is a schematic diagram of the gating circuit shown in FIG. 1, in accordance with some embodiments of the present disclosure.
FIG. 2B is a schematic diagram of the detecting circuit shown in FIG. 1, in accordance with some embodiments of the present disclosure.

FIG. 2A is a schematic diagram of the gating circuit 116 shown in FIG. 1, in accordance with some embodiments of the present disclosure. In some embodiments, the gating circuit 116 includes a flip flop 210 and a logic element 220.

As illustratively shown in FIG. 2A, a data input terminal (D) of the flip flop 210 is configured to receive the enable signal SCD, a clock input terminal of the flip flop 210 is configured to receive the clock signal CLK, and an output terminal (Q) of the flip flop 210 is configured to output an enable signal GN.

In some embodiments, the flip flop 210 is configured to transmit a logic value of the enable signal SCD to the output terminal of the flip flop 210, when the clock input terminal of the flip flop 210 is triggered by an edge of the clock signal CLK, to generate the enable signal GN. In some embodiments, the flip flop 210 is configured to invert a logic value and a corresponding voltage value of the clock signal CLK at the clock input terminal of the flip flop 210.

As illustratively shown in FIG. 2A, a first input terminal of the logic element 220 is configured to receive the enable signal GN, a second input terminal of the logic element 220 is configured to receive the clock signal CLK, and an output terminal of the logic element 220 is configured to output the gated clock signal GCLK. In some embodiments, the logic element 220 is implemented by an AND logic gate.

FIG. 2B is a schematic diagram of the detecting circuit 114 shown in FIG. 1, in accordance with some embodiments of the present disclosure. In some embodiments, detecting circuit 114 includes a flip flop 230.

As illustratively shown in FIG. 2B, a data input terminal (D) of the flip flop 230 is configured to receive the clock signal CLK, a clock input terminal of the flip flop 230 is configured to receive the enable signal SCD, and an output terminal (Q) of the flip flop 230 is configured to output the feedback signal PD.

In some embodiments, the flip flop 230 is configured to transmit a logic value of the clock signal CLK to the output terminal of the flip flop 230, when the clock input terminal of the flip flop 230 is triggered by an edge of the enable signal SCD, to generate the feedback signal PD.

Figure 3:
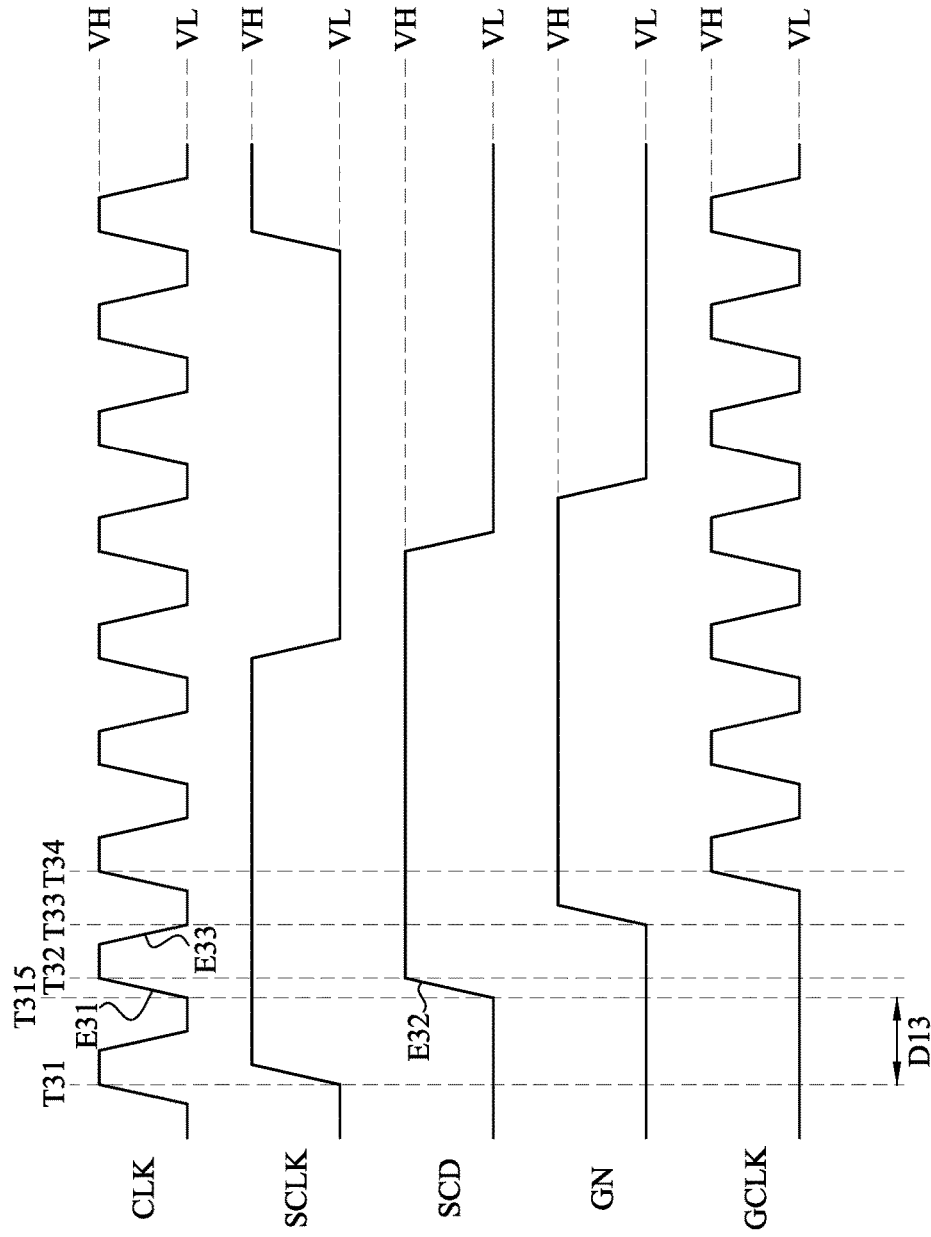
FIG. 3 is a timing diagram associated with operations of the signal generating device shown in FIG. 1, in accordance with some embodiments of the present disclosure.

FIG. 3 is a timing diagram 300 associated with operations of the signal generating device 110 shown in FIG. 1, in accordance with some embodiments of the present disclosure. As illustratively shown in FIG. 3, the timing diagram 300 includes moments T31, T315, and T32-T34 arranged in order.

As illustratively shown in FIG. 3, before the moment T31, the clock signal CLK is adjusted from the voltage level VL to the voltage level VH. The clock signal CLK has the voltage level VH at the moment T31. Accordingly, the enable signal SCLK has the voltage level VL at the moment T31, and is adjusted from the voltage level VL to the voltage level VH after the moment T31. In the embodiment shown in FIG. 3, after the moment T31, the clock signal CLK is adjusted from the voltage level VH to the voltage level VL between the moments T31 and T32. In some embodiments, the voltage level VH is higher than the voltage level VL.

Referring to FIG. 1 and FIG. 3, in the embodiment shown in FIG. 3, the dividing circuit 112 divides the frequency of the clock signal CLK by approximately four to generate the enable signal SCLK. In various embodiments, the dividing circuit 112 divides the frequency of the clock signal CLK by various numbers to generate the enable signal SCLK.

As illustratively shown in FIG. 3, a time length between the moments T31 and T315 corresponds to a delay time period D13. Referring to FIG. 1 and FIG. 3, the delaying circuit 113 is configured to delay the enable signal SCLK by the delay time period D13 to generate the enable signal SCD.

At the moment T315, each of the clock signal CLK and the enable signal SCD has the voltage level VL. Between the moments T315 and T32, the clock signal CLK is adjusted from the voltage level VL to the voltage level VH along a rising edge E31, and the enable signal SCD is adjusted from the voltage level VL to the voltage level VH along a rising edge E32. The rising edges E31 and E32 are aligned with each other between the moment T315 and T32.

In alternative embodiments, the edge E32 is slightly biased from the edge E31. For example, start of the edge E32 is aligned with end of the edge E31, or end of the edge E32 is aligned with start of the edge E31. In such alternative embodiments, the rising edges E31 and E32 are also considered as being aligned with each other.

At the moment T32, each of the clock signal CLK and the enable signal SCD has the voltage level VH. In some embodiments, the moment T32 is defined to be a moment of the end of the rising edge E32, and the moment T315 is defined to be a moment of the start of the rising edge E32.

Referring to FIG. 1 and FIG. 3, in some embodiments, when the rising edges E31 and E32 are not aligned with each other, the controlling circuit 115 is configured to adjust a time length of the delay time period D13 to adjust the enable signal SCD, until the rising edges E31 and E32 are aligned with each other. Further details of the controlling circuit 115 adjusting the delay time period D13 are described below with embodiments associated with FIG. 4A to FIG. 8.

Before the moment T33, the clock signal CLK is adjusted from the voltage level VH to the voltage level VL along a falling edge E33. At the moment T33, clock signal CLK has the voltage level VL and the enable signal SCD has the voltage level VH. Referring to FIG. 2A and FIG. 3, the flip flop 210 is triggered by the falling edge E33 to generate the enable signal GN according to the enable signal SCD. Accordingly, the enable signal GN is adjusted from the voltage level VL to the voltage level VH after the moment T33.

Before the moment T34, the clock signal CLK is adjusted from the voltage level VL to the voltage level VH, and the enable signal GN has the voltage level VH. Referring to FIG. 2A and FIG. 3, the logic element 220 is configured to perform a logic operation, such as an AND operation, to the clock signal CLK and the enable signal GN, to generate the gated clock signal GCLK. Accordingly, the gated clock signal GCLK is adjusted from the voltage level VL to the voltage level VH before the moment T34, and starts to oscillate between the voltage level VL and the voltage level VH after the moment T34. In the embodiment shown in FIG. 3, before the moment T34, the gated clock signal GCLK does not oscillate and stays at the voltage level VL.

Referring to FIG. 1 and FIG. 3, after the gated clock signal GCLK starts to oscillate, the signal generating device 110 is configured to apply the gated clock signal GCLK to the processing device 120 to adjust the voltage difference VDF after the moment T34, such that the measuring device 130 is able to measure the impedance of the power delivery network. In some embodiments, before the moment T34, the measuring device 130 does not measure the impedance.

In some approaches, a gated clock signal for impedance measurement is generated according to an enable signal and a clock signal. A small jitter of the enable signal causes a large jitter of the gated clock signal. The jitter of the gated clock signal impacts impedance plot result accuracy, such that the impedance measurement is poor.

Compared to the above approaches, in some embodiments of the present disclosure, the signal generating device 110 is configured to align the edge E32 with E31 according to the feedback signal PD, such that a jitter of the enable signal SCD does not impact the gated clock signal GCLK. As a result, the impedance measurement of the measuring device 130 is improved.

Figure 4A:
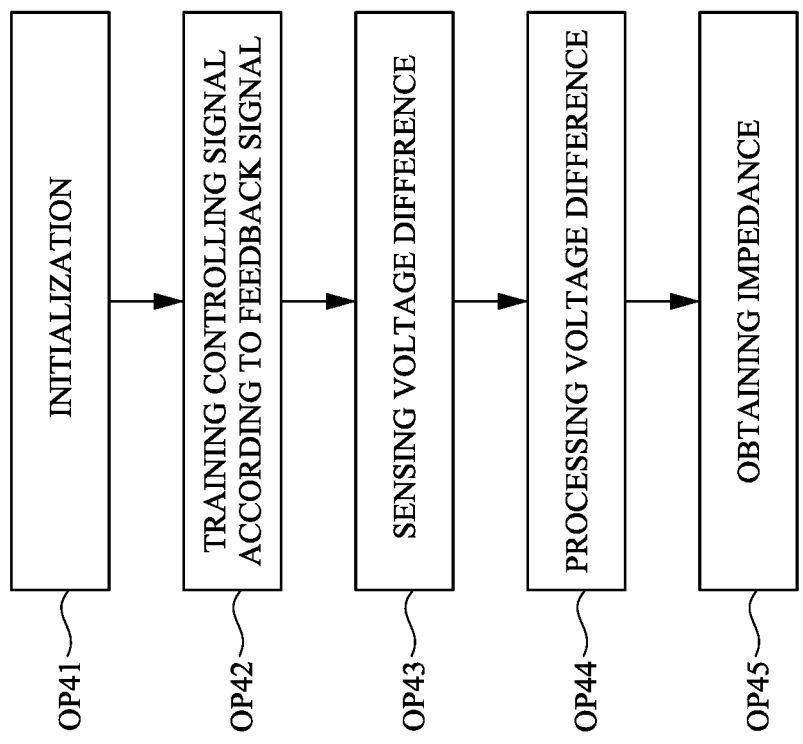
FIG. 4A is a flowchart diagram of operations of the system shown in FIG. 1, in accordance with some embodiments of the present disclosure.

FIG. 4A is a flowchart diagram of operations of the system 100 shown in FIG. 1, in accordance with some embodiments of the present disclosure. As illustratively shown in FIG. 4A, a method 400A includes operations OP41-OP45 performed in order.

Referring to FIG. 4A and FIG. 1, at the operation OP41, initializations of the signals of the system 100 are performed. For example, referring to FIG. 3, the clock signal CLK, the enable signals SCLK, SCD, GN and the gated clock signal GCLK are initialized to the voltage level VL before the moment T31. In some embodiments, a logic value of the feedback signal PD shown in FIG. 1 and a value of an accumulated value CPD for the operation OP42 are initialized to zero.

At the operation OP42, the controlling circuit 115 is configured to train the controlling signal DLY according to the feedback signal PD. Further details of the controlling circuit 115 training the controlling signal DLY are described below with embodiments associated with FIG. 4B.

At the operation OP43, the measuring device 130 is configured to sense the voltage difference VDF, when the gated clock signal GCLK applied to the processing device 120 oscillates.

At the operation OP44, numerical methods, such as Fast Fourier Transform (FFT), are performed to process the voltage difference VDF, to calculate the impedance of the power delivery network. At the operation OP45, a profile of the impedance is obtained. In some embodiments, the profile is presented as a function of frequencies of the voltage difference VDF.

Figure 4B:
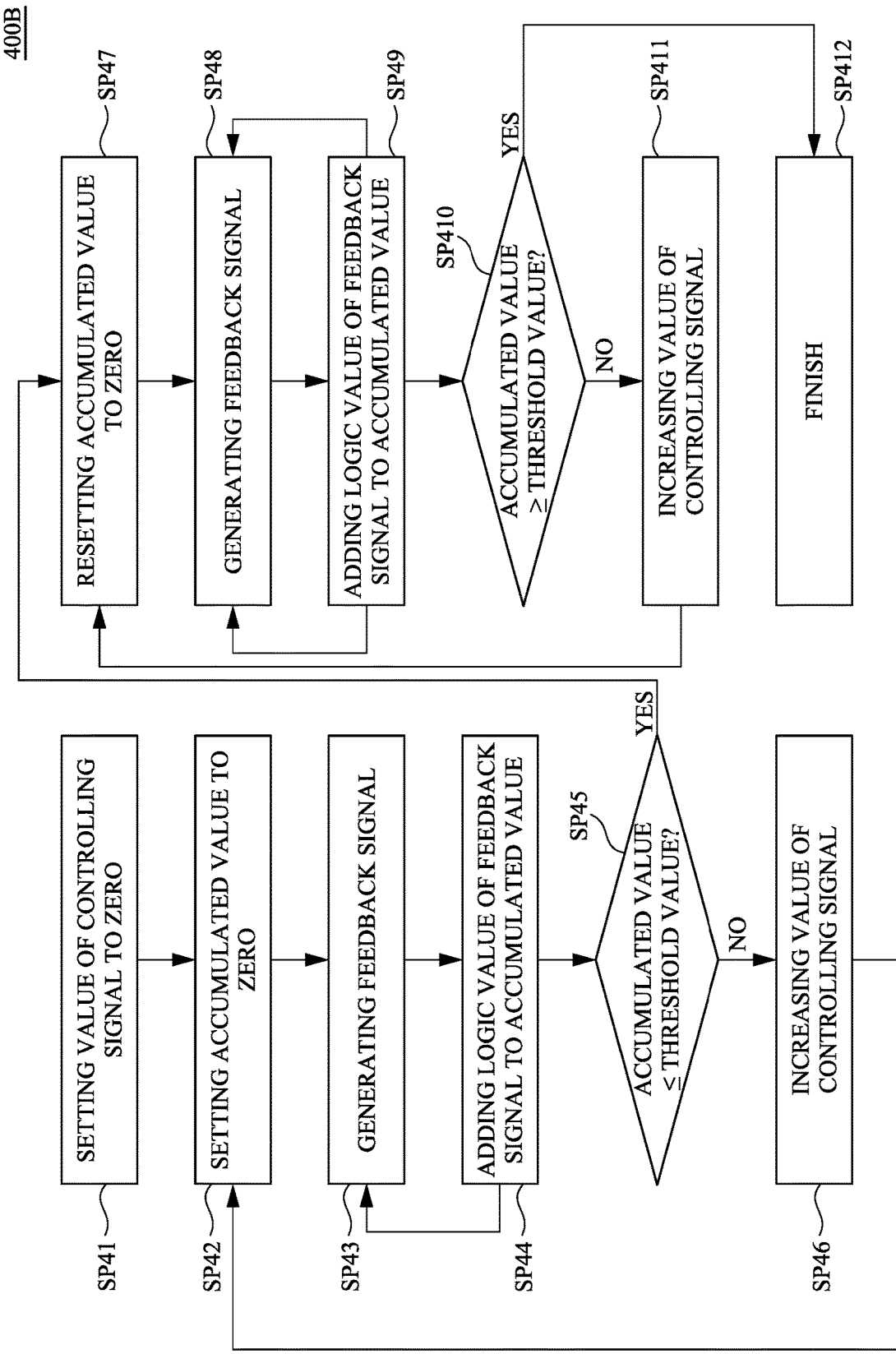
FIG. 4B is a flowchart diagram of operations of the signal generating device shown in FIG. 1, in accordance with some embodiments of the present disclosure.

FIG. 4B is a flowchart diagram of operations of the signal generating device 110 shown in FIG. 1, in accordance with some embodiments of the present disclosure. As illustratively shown in FIG. 4B, a method 400B includes operations SP41-SP412. Referring to FIG. 4A and FIG. 4B, the operation OP42 corresponds to the method 400B. For example, the operation OP42 includes at least some of the operations SP41-SP412.

Referring to FIG. 1 and FIG. 4B, at the operation SP41, the controlling circuit 115 is configured to set a digital value of the controlling signal DLY to an initial value, such as zero. Referring to FIG. 1 and FIG. 3, the delay time period D13 depends on the digital value of the controlling signal DLY in some embodiments. For example, when the digital value of the controlling signal DLY is increased by one, the controlling circuit increases the delay time period D13 is increased by a delay time period D51 shown in FIG. 5A.

At the operation SP42, the controlling circuit 115 is configured to set the accumulated value CPD to an initial value, such as zero.

At the operation SP43, the detecting circuit 114 is configured to detect a voltage level of the clock signal CLK at a moment of an edge of the enable signal SCD, to generate the feedback signal PD. For example, referring to FIG. 4B and FIG. 3, the detecting circuit 114 detects the voltage level VH of the clock signal CLK at the moment T32 of the edge E32 of the enable signal SCD. In some embodiments, when the edge E32 and the edge E31 are not aligned with each other, the detecting circuit 114 detects a voltage level other than the voltage level VH, of the clock signal CLK. Further details of the detecting circuit 114 detecting the clock signal CLK are described below with embodiments associated with FIG. 5A to FIG. 5D.

In some embodiments, the logic value of the feedback signal PD depends on the voltage level of the clock signal CLK at the moment T32. For example, in response to the clock signal CLK has the voltage level VH at the moment T32, the feedback signal PD has a logic value of one. In response to the clock signal CLK has the voltage level VL at the moment T32, the feedback signal PD has the logic value of zero. In response to the clock signal CLK has a voltage level between the voltage levels VL and VH at the moment T32, the feedback signal PD has a first possibility to have the logic value of zero, and has a second possibility to have the logic value of one. In some embodiments, the first possibility is decreased and the second possibility is increased when the voltage level of clock signal CLK is increased. In some embodiments, the first possibility plus the second possibility is equal to one.

At the operation SP44, the controlling circuit 115 is configured to add the logic value of the feedback signal PD to the accumulated value CPD. In some embodiments, in response to the feedback signal PD having the logic value of one, the controlling circuit 115 increases the accumulated value CPD by one. In response to the feedback signal PD having the logic value of zero, the controlling circuit 115 does not increase the accumulated value CPD.

In some embodiments, the signal generating device 110 is configured to perform the operations SP43 and SP44 for a positive integer number N31 times, to accumulate logic values of the feedback signal PD for the accumulated value CPD. When the clock signal CLK has the voltage level VH, the accumulated value CPD is equal to the number N31. When the clock signal CLK has the voltage level VL, the accumulated value CPD is equal to zero. When the clock signal CLK has a voltage level between the voltage levels VL and VH, the accumulated value CPD is between the number N31 and zero. In some embodiments, the accumulated value CPD is increased when the voltage level of the clock signal CLK is increased.

After the operations SP43 and SP44 are repeated for the number N31 times, the operation SP45 is performed. At the operation SP45, the controlling circuit 115 is configured to compare the accumulated value CPD with a threshold value TH1. In some embodiments, the threshold value TH1 is between the number N31 and zero.

In response to the accumulated value CPD being smaller than or equal to the threshold value TH1, the operation SP47 is performed. In response to the accumulated value CPD being larger than the threshold value TH1, the operation SP46 is performed.

Figure 5A:
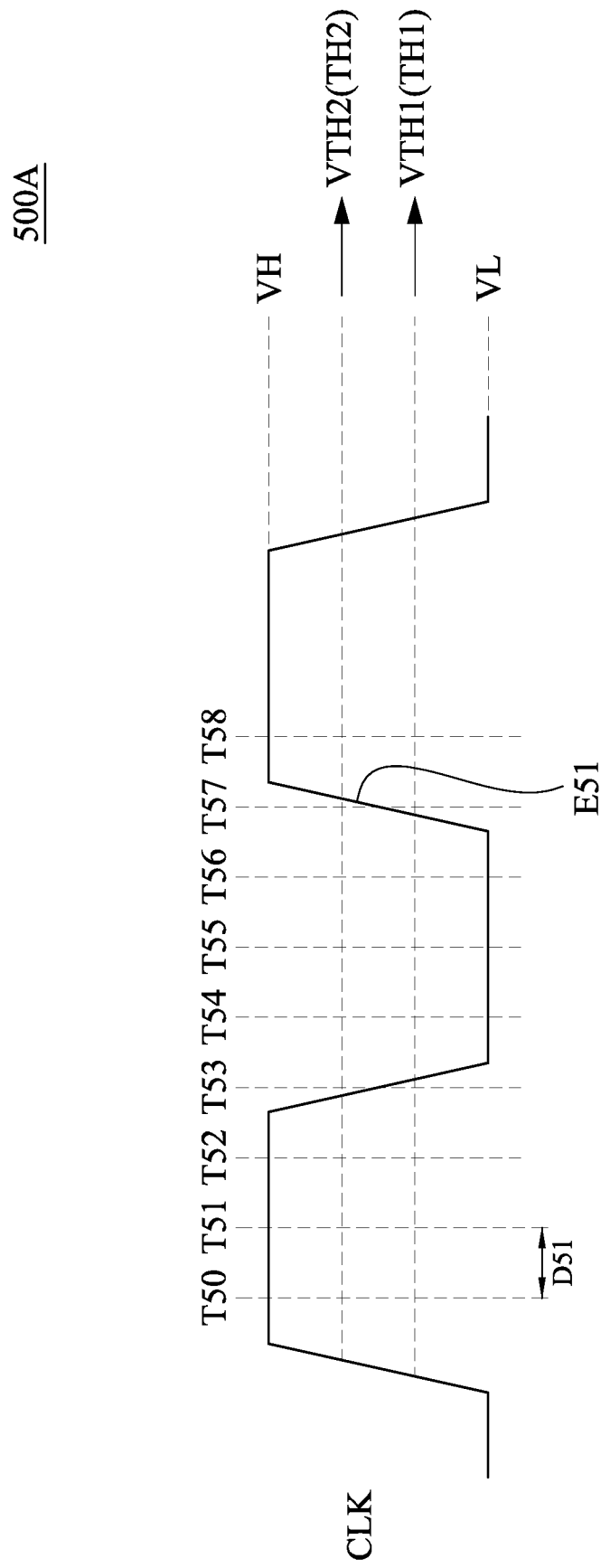
FIG. 5A is a timing diagram of the clock signal shown in FIG. 1, in accordance with some embodiments of the present disclosure.

In some embodiments, the threshold value TH1 corresponds to a threshold voltage level VTH1 as shown in FIG. 5A. When the voltage level of the clock signal CLK is lower than the threshold voltage level VTH1, the controlling circuit 115 determines that the clock signal CLK has the voltage level VL at the moment T32 of the edge E32. After the clock signal CLK has the voltage level VL, the controlling circuit 115 is configured to perform the operations SP47-SP412 to search the voltage level VH of the clock signal CLK, and to determine a rising edge of the clock signal CLK between a moment of the voltage level VL and a moment of the voltage level VH.

When the voltage level of the clock signal CLK is higher than or equal to the threshold voltage level VTH1, the controlling circuit 115 determines that the clock signal CLK does not have the voltage level VL at the moment T32 of the edge E32. Accordingly, the controlling circuit 115 performs the operation SP46 to adjust the edge E32.

At the operation SP46, the controlling circuit 115 is configured to adjust the digital value of the controlling signal DLY. For example, the controlling circuit 115 increases the digital value of the controlling signal DLY by one. Accordingly, the delay time period D13 is increased and the edge E32 is delayed. After the operation SP46, the operation SP42-SP45 are performed again to compare the voltage level of the clock signal CLK at the delayed edge E32 and the threshold voltage level VTH1, by comparing the accumulated value CPD corresponding to the delayed edge E32 and the threshold value TH1.

At the operation SP47, the controlling circuit 115 is configured to reset the accumulated value CPD to the initial value. At the operation SP48, the detecting circuit 114 is configured to detect the voltage level of the clock signal CLK at the moment of the edge of the enable signal SCD, to generate the feedback signal PD. At the operation SP49, the controlling circuit 115 is configured to add the logic value of the feedback signal PD to the accumulated value CPD.

In some embodiments, the signal generating device 110 is configured to perform the operations SP48 and SP49 for a positive integer number N32 times, to accumulate logic values of the feedback signal PD, to generate the accumulated value CPD. In some embodiments, the number N32 is equal to the number N31.

After the operations SP48 and SP49 are repeated for the number N32 times, the operation SP410 is performed. At the operation SP410, the controlling circuit 115 is configured to compare the accumulated value CPD with a threshold value TH2. In some embodiments, the threshold value TH2 is between the number N31 and the threshold value TH1.

In response to the accumulated value CPD being larger than or equal to the threshold value TH2, the operation SP412 is performed. In response to the accumulated value CPD being smaller than the threshold value TH2, the operation SP411 is performed.

In some embodiments, the threshold value TH2 corresponds to a threshold voltage level VTH2 as shown in FIG. 5A. When the voltage level of the clock signal CLK is higher than the threshold voltage level VTH2, the controlling circuit 115 determines that the clock signal CLK has the voltage level VH at the moment T32 of the edge E32. When the clock signal CLK has the voltage level VH after the operation SP45, the controlling circuit 115 is configured to determine that the edge E32 is aligned with a rising edge of the clock signal CLK. Accordingly, the operation SP412 is performed. At the operation SP412, the training of the operation OP42 shown in FIG. 4A is finished, and the controlling circuit 115 stops further adjusting the delay time period D13.

When the voltage level of the clock signal CLK is lower than or equal to the threshold voltage level VTH1, the controlling circuit 115 determines that the clock signal CLK does not have the voltage level VH at the moment T32 of the edge E32. Accordingly, the controlling circuit 115 performs the operation SP411 to further adjust the edge E32.

At the operation SP411, the controlling circuit 115 is configured to adjust the digital value of the controlling signal DLY. For example, the controlling circuit 115 increases the digital value of the controlling signal DLY by one. Accordingly, the delay time period D13 is increased and the edge E32 is delayed. After the operation SP411, the operation SP47-SP410 are performed again to compare the voltage level of the clock signal CLK at the delayed edge E32 and the threshold voltage level VTH2, by comparing the accumulated value CPD corresponding to the delayed edge E32 and the threshold value TH2.

The operations SP47-SP411 are similar with the operations SP42-SP46, respectively. Therefore, some descriptions are not repeated for brevity. In some embodiments, the operation OP42 shown in FIG. 4A includes a part of the method 400B. For example, the signal generating device 110 performs the operations SP47-SP411 to find the rising edge of the clock signal CLK, according to the comparison result of the operation SP410.

FIG. 5A is a timing diagram 500A of the clock signal CLK shown in FIG. 1, in accordance with some embodiments of the present disclosure. As illustratively shown in FIG. 5A, the timing diagram 500A includes moments T50-T58 arranged in order. In some embodiments, a time length between each two adjacent moments of the moments T50-

T58 corresponds to a delay time period D51. For example, a time length between the adjacent moments T50 and T51 corresponds to the delay time period D51, and a time length between the adjacent moments T51 and T52 also corresponds to the delay time period D51.

In some embodiments, the edge E32 is aligned with the moment T50 before the method 400B is performed. Referring to FIG. 1 to FIG. 5A, when the detecting circuit 114 is triggered by the edge E32 to detect the clock signal CLK at the moment T50, the operations SP41-SP45 are performed to generate the accumulated value CPD corresponding to the voltage level VH of the clock signal CLK. The accumulated value CPD is larger than the threshold value TH1.

Accordingly, the operation SP46 is performed to increase the digital value of the controlling signal DLY by one. The controlling circuit 115 is configured to delay the edge E32 by the delay time period D51, such that the edge E32 is aligned with the moment T51.

When the detecting circuit 114 is triggered by the edge E32 to detect the clock signal CLK at the moment T51, the operations SP41-SP45 are performed again to generate the accumulated value CPD larger than the threshold value TH1. Accordingly, the operation SP46 is performed again to increase the digital value of the controlling signal DLY by one, to delay the edge E32 by the delay time period D51, such that the edge E32 is aligned with the moment T52.

Similarly, when the detecting circuit 114 is triggered by the edge E32 to detect the clock signal CLK at the moment T52, the operations SP41-SP46 are performed again to delay the edge E32 by the delay time period D51, such that the edge E32 is aligned with the moment T53.

When the detecting circuit 114 is triggered by the edge E32 to detect the clock signal CLK at the moment T53, the operations SP41-SP45 are performed again to generate the accumulated value CPD corresponding to the voltage level of the clock signal CLK at the moment T53. In response to the voltage level of the clock signal CLK at the moment T53 is higher than the voltage level VTH1, the accumulated value CPD is larger than the threshold value TH1.

Accordingly, the operation SP46 is performed to increase the digital value of the controlling signal DLY by one. The controlling circuit 115 is configured to delay the edge E32 by the delay time period D51, such that the edge E32 is aligned with the moment T54.

When the detecting circuit 114 is triggered by the edge E32 to detect the clock signal CLK at the moment T54, the operations SP41-SP45 are performed again to generate the accumulated value CPD corresponding to the voltage level VL of the clock signal CLK at the moment T54. In response to the voltage level VL is lower than the voltage level VTH1, the accumulated value CPD is smaller than the threshold value TH1. Accordingly, the controlling circuit 115 determines that the voltage level VL of the clock signal CLK is found and the operation SP47-SP411 are performed to delay the edge E32 by the delay time period D51, such that the edge E32 is aligned with the moment T55.

When the detecting circuit 114 is triggered by the edge E32 to detect the clock signal CLK at the moment T55, the operations SP47-SP410 are performed again to generate the accumulated value CPD corresponding to the voltage level VL of the clock signal CLK at the moment T55. In response to the voltage level VL is lower than the voltage level VTH2, the accumulated value CPD is smaller than the threshold value TH2.

Accordingly, the operation SP411 is performed to increase the digital value of the controlling signal DLY by one. The controlling circuit 115 is configured to delay the edge E32 by the delay time period D51, such that the edge E32 is aligned with the moment T56.

When the detecting circuit 114 is triggered by the edge E32 to detect the clock signal CLK at the moment T56, the operations SP47-SP410 are performed again to generate the accumulated value CPD corresponding to the voltage level VL of the clock signal CLK at the moment T56. In response to the voltage level VL is lower than the voltage level VTH2, the accumulated value CPD is smaller than the threshold value TH2.

Accordingly, the operation SP411 is performed to increase the digital value of the controlling signal DLY by one. The controlling circuit 115 is configured to delay the edge E32 by the delay time period D51, such that the edge E32 is aligned with the moment T57.

When the detecting circuit 114 is triggered by the edge E32 to detect the clock signal CLK at the moment T57, the operations SP47-SP410 are performed again to generate the accumulated value CPD corresponding to a voltage level of the clock signal CLK at the moment T57. In response to the voltage level of the clock signal CLK at the moment T57 is lower than the voltage level VTH2, the accumulated value CPD is smaller than the threshold value TH2.

Accordingly, the operation SP411 is performed to increase the digital value of the controlling signal DLY by one. The controlling circuit 115 is configured to delay the edge E32 by the delay time period D51, such that the edge E32 is aligned with the moment T58.

When the detecting circuit 114 is triggered by the edge E32 to detect the clock signal CLK at the moment T58, the operations SP47-SP410 are performed again to generate the accumulated value CPD corresponding to the voltage level VH of the clock signal CLK at the moment T58. In response to the voltage level VH is higher than the voltage level VTH2, the accumulated value CPD is larger than the threshold value TH2.

Accordingly, the operation SP412 is performed. The controlling circuit 115 is configured to determine that a rising edge E51 of the clock signal is found and aligned with the edge E32. Referring to FIG. 3 and FIG. 5A, the rising edge E51 corresponds to the rising edge E31.

Figures 5B, 5C, 5D:
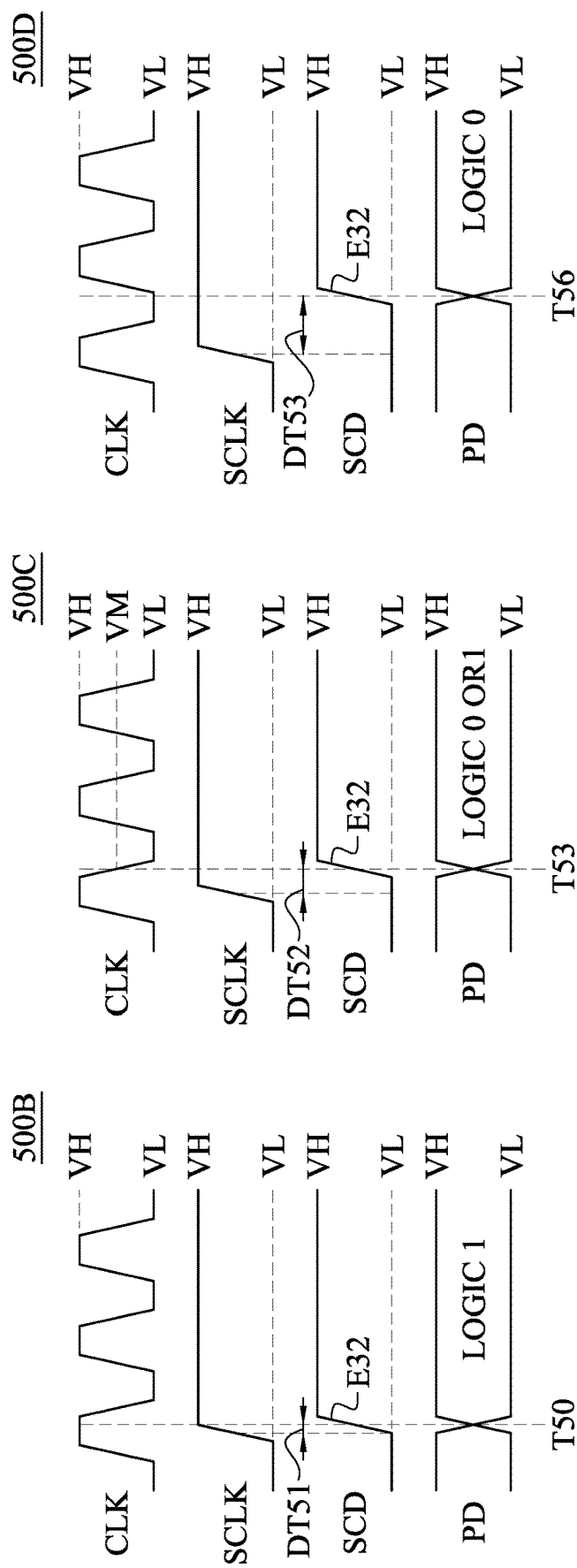
FIG. 5B is a timing diagram of the clock signal, the enable signals and the feedback signal shown in FIG. 1, in accordance with some embodiments of the present disclosure.
FIG. 5C is a timing diagram of the clock signal, the enable signals, and the feedback signal shown in FIG. 1, in accordance with some other embodiments of the present disclosure.
FIG. 5D is a timing diagram of the clock signal, the enable signals, and the feedback signal shown in FIG. 1, in accordance with various embodiments of the present disclosure.

FIG. 5B is a timing diagram 500B of the clock signal CLK, the enable signals SCLK, SCD and the feedback signal PD shown in FIG. 1, in accordance with some embodiments of the present disclosure. Referring to FIG. 5B and FIG. 5A, the timing diagram 500B corresponding to a condition that the edge E32 is aligned with the moment T50.

As illustratively shown in FIG. 5B, the enable signal SCLK is delayed by a delay time period DT51 which corresponds to the delay time period D13 shown in FIG. 3, to generate the enable signal SCD. The detecting circuit 114 is configured to be triggered by the edge E32 to detect the clock signal at the moment T50. In response to the clock signal having the voltage level VH at the moment T50, the feedback signal PD has the logic value of one.

FIG. 5C is a timing diagram 500C of the clock signal CLK, the enable signals SCLK, SCD and the feedback signal PD shown in FIG. 1, in accordance with some other embodiments of the present disclosure. Referring to FIG. 5C and FIG. 5A, the timing diagram 500C corresponding to a condition that the edge E32 is aligned with the moment T53.

As illustratively shown in FIG. 5C, the enable signal SCLK is delayed by a delay time period DT52 which corresponds to the delay time period D13 shown in FIG. 3, to generate the enable signal SCD. The detecting circuit 114 is configured to be triggered by the edge E32 to detect the clock signal at the moment T53. In response to the clock signal having a voltage level VM at the moment T53, the feedback signal PD has the logic value of zero or one. As illustratively shown in FIG. 5C, the voltage level VM is between the voltage levels VL and VH.

FIG. 5D is a timing diagram 500D of the clock signal CLK, the enable signals SCLK, SCD and the feedback signal PD shown in FIG. 1, in accordance with various embodiments of the present disclosure. Referring to FIG. 5D and FIG. 5A, the timing diagram 500D corresponding to a condition that the edge E32 is aligned with the moment T56.

As illustratively shown in FIG. 5D, the enable signal SCLK is delayed by a delay time period DT53 which corresponds to the delay time period D13 shown in FIG. 3, to generate the enable signal SCD. The detecting circuit 114 is configured to be triggered by the edge E32 to detect the clock signal at the moment T56. In response to the clock signal having the voltage level VL at the moment T56, the feedback signal PD has the logic value of zero.

Figure 6:
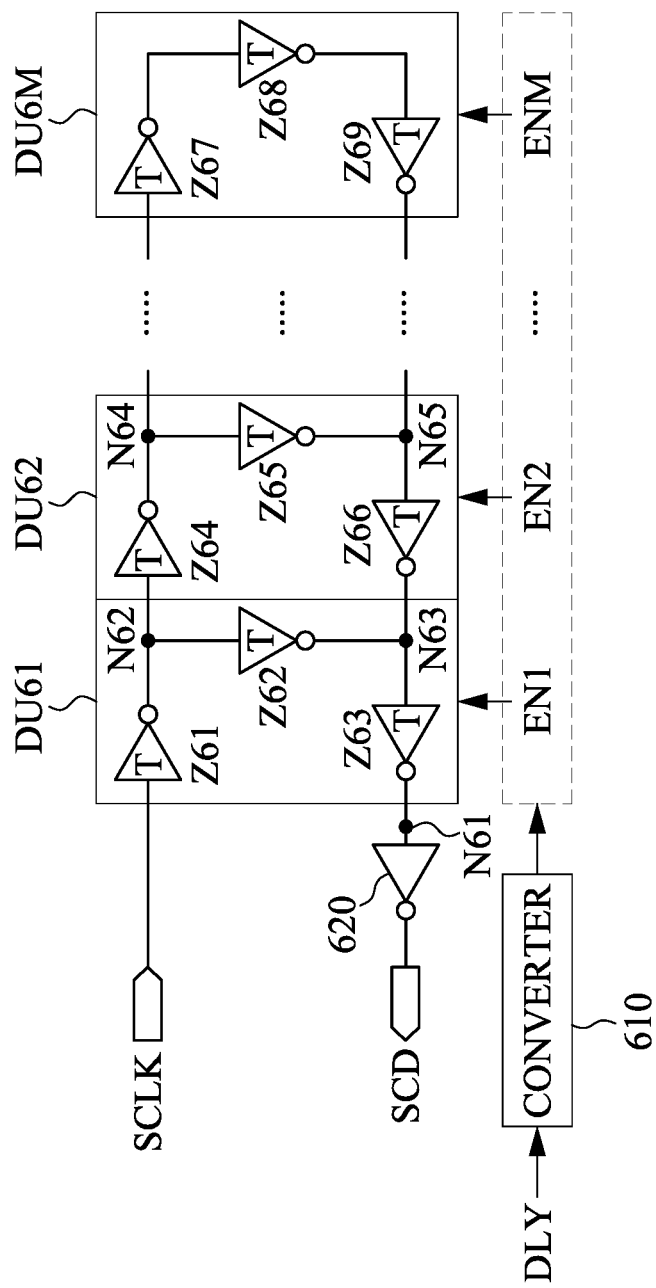
FIG. 6 is a schematic diagram of the delaying circuit corresponding to the delaying circuit shown in FIG. 1, in accordance with some embodiments of the present disclosure.

FIG. 6 is a schematic diagram of the delaying circuit 600 corresponding to the delaying circuit 113 shown in FIG. 1, in accordance with some embodiments of the present disclosure. Referring to FIG. 6 and FIG. 1, the delaying circuit 600 is an embodiment of the delaying circuit 113.

In some embodiments, the delaying circuit 600 includes a converter 610, delaying units DU61-DU6M coupled in series and an inverter 620. It is noted that M is a positive integer. As illustratively shown in FIG. 6, the converter 610 is configured to generate enable signals EN1-ENM according to the controlling signal DLY. An input terminal of the inverter 620 is coupled to the delaying units DU61 at a node N61, an output terminal of the inverter 620 is configured to output the enable signal SCD. The delaying units DU61-DU6M are configured to delay the enable signal SCLK according to the enable signals EN1-ENM. In some embodiments, the converter 610 is implemented as a binary-to-thermometer code converter.

In some embodiments, each of the delaying units DU61-DU6M is configured to be turned on or off according to a corresponding one of the enable signals EN1-ENM. Each of the delaying units DU61-DU6M is configured to delay the enable signal SCLK when being turned on, and does not delay the enable signal SCLK when being turned off. For example, the delaying unit DU61 is turned on in response to the enable signal EN1 has the logic value of one, and is turned off in response to the enable signal EN1 has the logic value of zero. The delaying unit DU62 is turned on in response to the enable signal EN2 has the logic value of one, and is turned off in response to the enable signal EN2 has the logic value of zero. Further details of the operations delaying the enable signal SCLK are described below with embodiments associated with FIG. 7.

In some embodiments, the number of the enable signals EN1-ENM having the logic value of one is increased when the digital value of the controlling signal DLY is increased. Referring to FIG. 4B and FIG. 6, after one loop of the operations SP42-SP46 are performed, the enable signal EN1 has the logic value of one, and the enable signals EN2-ENM have the logic value of zero. After two loops of the operations SP42-SP46 are performed, the enable signals EN1 and EN2 have the logic value of one, and the enable signals EN3-ENM have the logic value of zero. After loops of the operations SP42-SP46 and loops of the operations SP47-SP411 are performed, the enable signals EN1-ENM have the logic value of one.

Referring to FIG. 3, FIG. 4B, FIG. 5A and FIG. 6, when the method 400B is performed, the delaying units DU61-DU6M are turned on in order, until the voltage level of the clock signal CLK at the edge E32 meets one of the threshold voltage levels VTH1 and VTH2.

In some embodiments, each of the delaying units DU61-DU6M includes three inverters coupled in series. As illustratively shown in FIG. 6, the delaying unit DU61 includes inverters Z61-Z63, the delaying unit DU62 includes inverters Z64-Z66 and the delaying unit DU6M includes inverters Z67-Z69.

As illustratively shown in FIG. 6, an input terminal of the inverter Z61 is configured to receive the enable signal SCLK, an output terminal of the inverter Z63 is coupled to the node N61. An output terminal of the inverter Z61, an input terminal of the inverter Z64 and an input terminal of the inverter Z62 are coupled to each other at the node N62. An output terminal of the inverter Z62, an output terminal of the inverter Z66 and an input terminal of the inverter Z63 are coupled to each other at the node N63.

As illustratively shown in FIG. 6, an output terminal of the inverter Z64 and an input terminal of the inverter Z65 are coupled to the delaying unit DU63 (not shown in FIG. 6) at a node N64. An output terminal of the inverter Z65 and an input terminal of the inverter Z66 are coupled to the delaying unit DU63 at a node N65. An input terminal of the inverter Z67 and an output terminal of the inverter Z69 are coupled to the delaying unit DU6(M-1) (not shown in FIG. 6). An output terminal of the inverter Z67 is coupled to an input terminal of the inverter Z68. An output terminal of the inverter Z68 is coupled to an input terminal of the inverter Z69.

In some embodiments, each of the inverters Z61-Z69 further includes a control terminal. The control terminals of the inverters Z61-Z63 are configured to receive enable signals corresponding to the enable signal EN1, the control terminals of the inverters Z64-Z66 are configured to receive enable signals corresponding to the enable signal EN2, and the control terminals of the inverters Z67-Z69 are configured to receive enable signals corresponding to the enable signal ENM. In some embodiments, each of the inverters Z61-Z69 is configured to be turned on or off according to the logic value of a corresponding enable signal.

For example, in response to the enable signal EN1 having the logic value of one and each of the enable signals EN2 and ENM having the logic value of zero, the inverters Z61-Z63 are turned on, the inverters Z64-Z69 are turned off, and the enable signal SCLK passing through the inverters Z61-Z63 and 620 in order, to generate the enable signal SCD.

For another example, in response to each of the enable signals EN1 and EN2 having the logic value of one and the enable signal ENM having the logic value of zero, the inverters Z61, Z63, Z64-Z66 are turned on, the inverters Z62 and Z67-Z69 are turned off, and the enable signal SCLK passing through the inverters Z61, Z64-Z66, Z63 and 620 in order, to generate the enable signal SCD.

For further example, in response to each of the enable signals EN1-ENM having the logic value of one, the inverters Z61, Z63, Z64, Z66 and Z67-Z69 are turned on, the inverters Z62 and Z65 are turned off, and the enable signal SCLK passing through the inverters Z61, Z64, Z67-Z69, Z66, Z63 and 620 in order, to generate the enable signal SCD.

Figure 7:
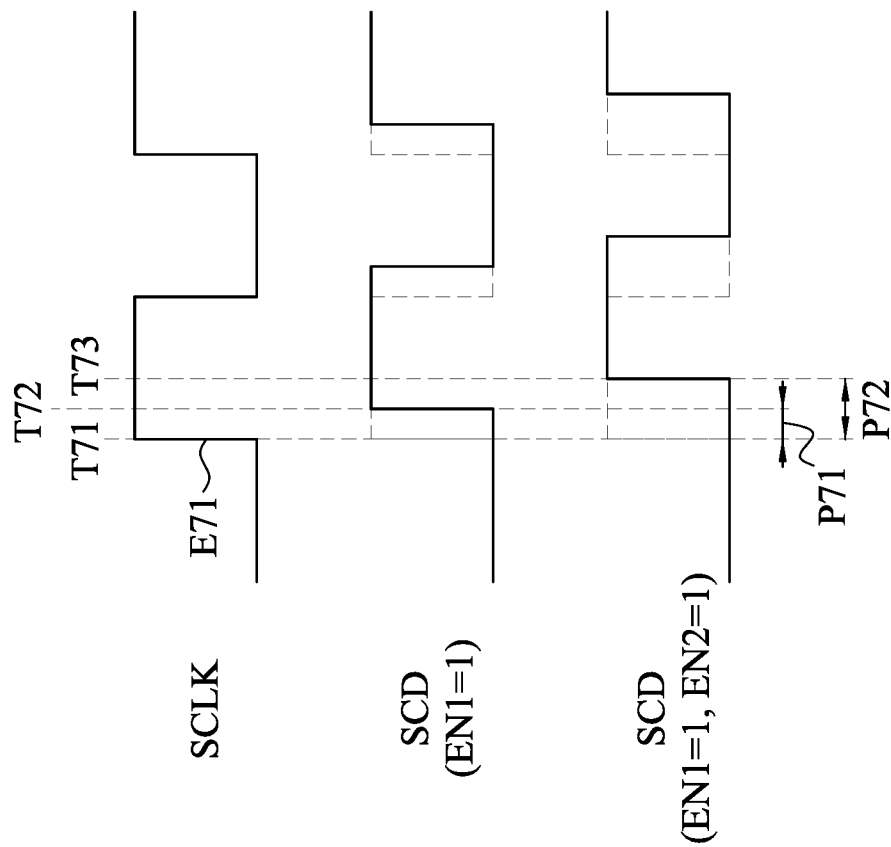
FIG. 7 is a timing diagram associated with operations of the delaying circuit shown in FIG. 6, in accordance with some embodiments of the present disclosure.

FIG. 7 is a timing diagram 700 associated with operations of the delaying circuit 600 shown in FIG. 6, in accordance with some embodiments of the present disclosure. As illustratively shown in FIG. 7, the timing diagram 700 includes moments T71-T73 arranged in order.

As illustratively shown in FIG. 7, a rising edge E71 of the enable signal SCLK is aligned with the moment T71. Referring to FIG. 7 and FIG. 6, when the enable signal EN1 has the logic value of 1, and each of the enable signals EN2-ENM has the logic value of 0, the delaying unit DU61 is turned on to delay the enable signal SCLK by a delay time period P71, and the delaying units DU62-DU6M are turned off and do not delay the enable signal SCLK.

Referring to FIG. 7 and FIG. 6, when each of the enable signals EN1 and EN2 has the logic value of 1, and each of the enable signals EN3-ENM has the logic value of 0, the delaying units DU61 and DU62 are turned on to delay the enable signal SCLK by a delay time period P72, and the delaying units DU63-DU6M are turned off and do not delay the enable signal SCLK.

As illustratively shown in FIG. 7, the delay time period P71 corresponds to a constant delay time period plus a first delay time period corresponding to the delaying unit DU61, and the delay time period P72 corresponds to the constant delay time period plus a second delay time period corresponding to the delaying units DU61 and DU62. In some embodiments, a length of the second delay time period is approximately twice of a length of the first delay time period. In some embodiments, the first delay time period corresponds to a delay resolution. Referring to FIG. 7 and FIG. 5A, the first delay time period is equal to the delay time period D51 in some embodiments.

Referring to FIG. 7, FIG. 6 and FIG. 4B, after the first loop of the operations SP42-SP46 are performed, the delaying unit DU61 is configured to increase a delay time period between the enable signal SCLK and the enable signal SCD by the first delay time period to generate the enable signal SCD with an edge aligned with the moment T72. After the second loop of the operations SP42-SP46 are performed, the delaying units DU61 and DU62 are configured to increase the delay time period between the enable signal SCLK and the enable signal SCD by the second delay time period to generate the enable signal SCD with an edge aligned with the moment T73.

In some embodiments, after multiple loops of the operations SP42-SP46 are performed, the accumulated value CPD is smaller than or equal to the threshold value TH1 shown in FIG. 5A, and then the operations SP47-SP411 are performed. When the operations SP47-SP411 are performed, the delaying unit DU6M is configured to further increase the delay time period between the enable signal SCLK and the enable signal SCD, until the accumulated value CPD is larger than or equal to the threshold value TH2.

Figure 8:
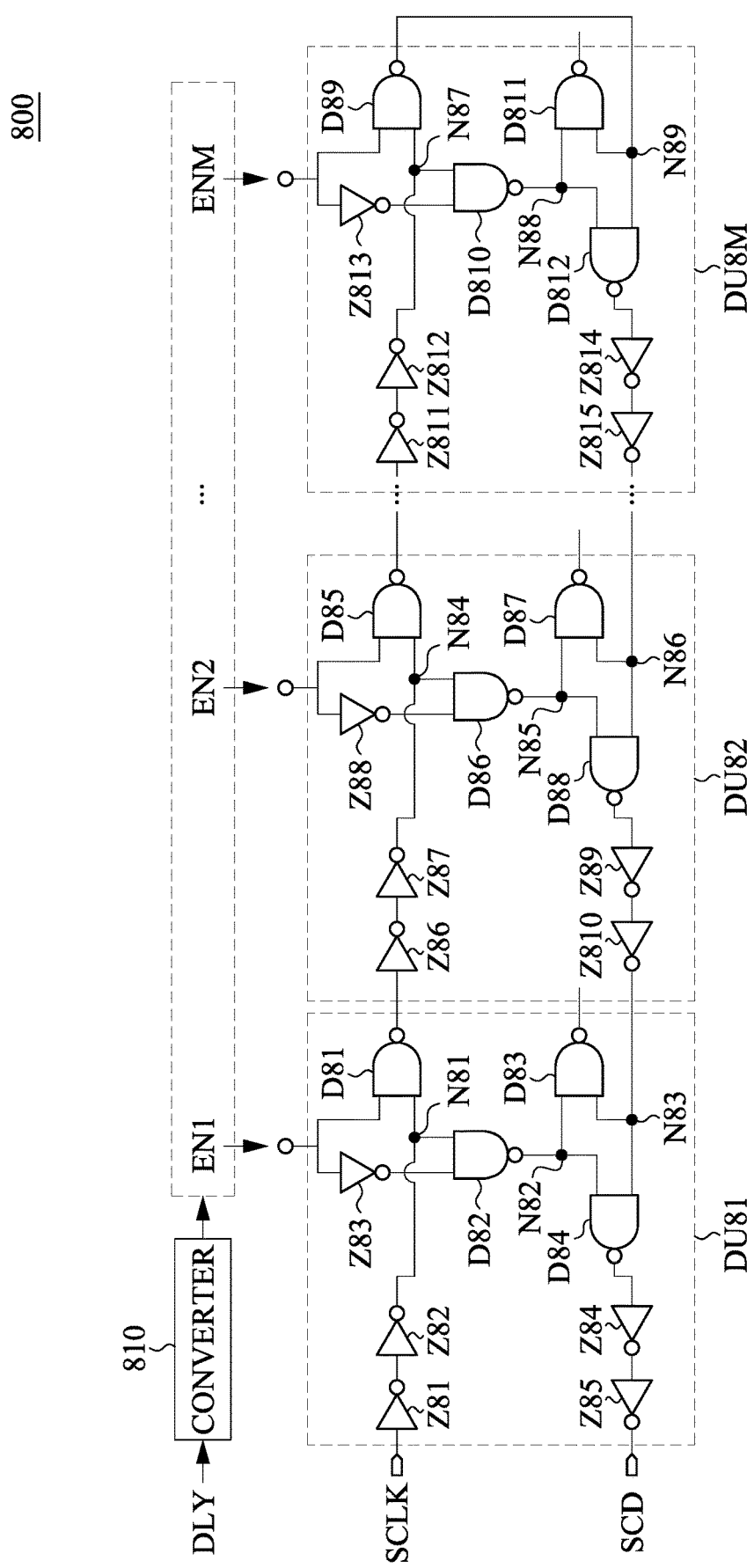
FIG. 8 is a schematic diagram of the delaying circuit corresponding to the delaying circuit shown in FIG. 1, in accordance with some embodiments of the present disclosure.

FIG. 8 is a schematic diagram of the delaying circuit 800 corresponding to the delaying circuit 113 shown in FIG. 1, in accordance with some embodiments of the present disclosure. Referring to FIG. 8 and FIG. 1, the delaying circuit 800 is an embodiment of the delaying circuit 113.

In some embodiments, the delaying circuit 800 includes a converter 810 and delaying units DU81-DU8M coupled in series. Referring to FIG. 8 and FIG. 6, the converter 810 and the delaying units DU81-DU8M correspond the converter 610 and the delaying units DU61-DU6M, respectively. Therefore, some descriptions are not repeated for brevity.

As illustratively shown in FIG. 8, the converter 810 is configured to generate enable signals EN1-ENM according to the controlling signal DLY. The delaying units DU81-DU8M are configured to delay the enable signal SCLK according to the enable signals EN1-ENM, to generate the enable signal SCD.

As illustratively shown in FIG. 8, the delaying unit DU81 includes inverters Z81-Z85 and NAND logic gates D81-D84. An input terminal of the inverter Z81 is configured to receive the enable signal SCLK, an output terminal of the inverter Z81 is coupled to an input terminal of the inverter Z82. An output terminal of the inverter Z82 is coupled to a node N81. A first input terminal of the NAND logic gate D81 is coupled to the node N81, a second input terminal of the NAND logic gate D81 and an input terminal of the inverter Z83 are configured to receive the enable signal EN1. An output terminal of the inverter Z83 is coupled to a first input terminal of the NAND logic gate D82, a second input terminal of the NAND logic gate D82 is coupled to the node N81.

As illustratively shown in FIG. 8, an output terminal of the NAND logic gate D82, a first input terminal of the NAND logic gate D83 and a first input terminal of the NAND logic gate D84 are coupled to a node N82. A second input terminal of the NAND logic gate D83 and a second input terminal of the NAND logic gate D84 are coupled to a node N83. An output terminal of the NAND logic gate D84 is coupled to an input terminal of the inverter Z84. An output terminal of the inverter Z84 is coupled to an input terminal of the inverter Z85. An output terminal of the inverter Z85 is configured to output the enable signal SCD.

As illustratively shown in FIG. 8, the delaying unit DU82 includes inverters Z86-Z810 and NAND logic gates D85-D88. An input terminal of the inverter Z86 is coupled to an output terminal of the NAND logic gate D81, an output terminal of the inverter Z86 is coupled to an input terminal of the inverter Z87. An output terminal of the inverter Z87 is coupled to a node N84. A first input terminal of the NAND logic gate D85 is coupled to the node N84, a second input terminal of the NAND logic gate D85 and an input terminal of the inverter Z88 are configured to receive the enable signal EN2. An output terminal of the inverter Z88 is coupled to a first input terminal of the NAND logic gate D86, a second input terminal of the NAND logic gate D86 is coupled to the node N84.

As illustratively shown in FIG. 8, an output terminal of the NAND logic gate D86, a first input terminal of the NAND logic gate D87 and a first input terminal of the NAND logic gate D88 are coupled to a node N85. A second input terminal of the NAND logic gate D87 and a second input terminal of the NAND logic gate D88 are coupled to a node N86. An output terminal of the NAND logic gate D88 is coupled to an input terminal of the inverter Z89. An output terminal of the inverter Z89 is coupled to an input terminal of the inverter Z810. An output terminal of the inverter Z810 is coupled to the node N83. In some embodiments, the node N86 and an output terminal of the NAND logic gate D85 is coupled to the delaying unit DU83 (not shown in FIG. 8).

As illustratively shown in FIG. 8, the delaying unit DU8M includes inverters Z811-Z815 and NAND logic gates D89-D812. An input terminal of the inverter Z811 is coupled to the delaying unit DU8(M-1) (not shown in FIG. 8), an output terminal of the inverter Z811 is coupled to an input terminal of the inverter Z812. An output terminal of the inverter Z812 is coupled to a node N87. A first input terminal of the NAND logic gate D89 is coupled to the node N87, a second input terminal of the NAND logic gate D89 and an input terminal of the inverter Z813 are configured to receive the enable signal ENM. An output terminal of the inverter Z813 is coupled to a first input terminal of the NAND logic gate D810, a second input terminal of the NAND logic gate D810 is coupled to the node N87.

As illustratively shown in FIG. 8, an output terminal of the NAND logic gate D810, a first input terminal of the NAND logic gate D811 and a first input terminal of the NAND logic gate D812 are coupled to a node N88. A second input terminal of the NAND logic gate D811 and a second input terminal of the NAND logic gate D812 are coupled to a node N89. An output terminal of the NAND logic gate D812 is coupled to an input terminal of the inverter Z814. An output terminal of the inverter Z814 is coupled to an input terminal of the inverter Z815. An output terminal of the inverter Z815 is coupled to the delaying unit DU8(M-1).

Figure 9A:
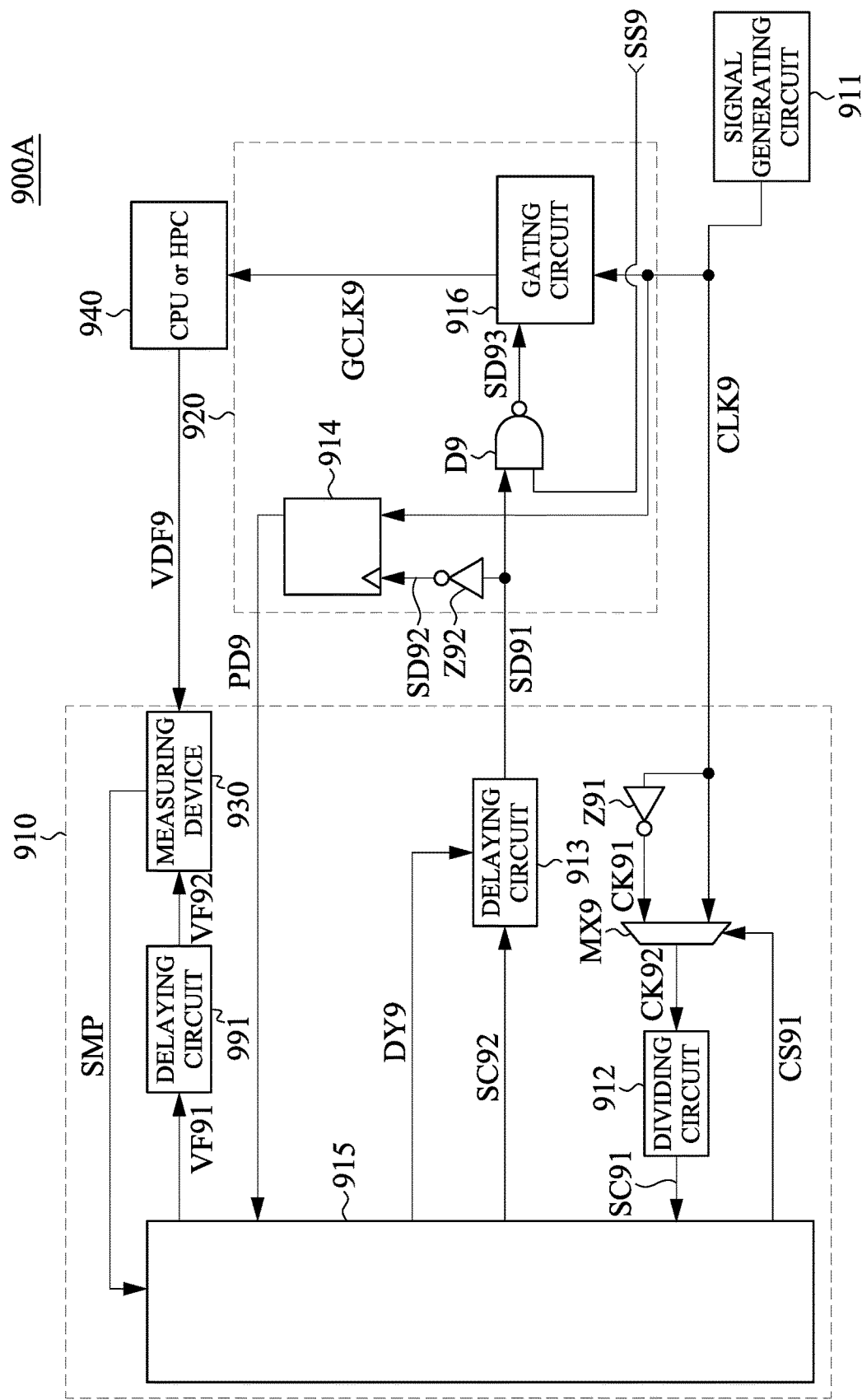
FIG. 9A is a schematic diagram of a system corresponding to the system shown in FIG. 1, in accordance with some embodiments of the present disclosure.

FIG. 9A is a schematic diagram of a system 900A corresponding to the system 100 shown in FIG. 1, in accordance with some embodiments of the present disclosure. In some embodiments, the system 900A includes a measuring block 910, a feedback block 920, a signal generating circuit 911 and a processing device 940. In some embodiments, the processing device 940 is implemented by a CPU, an HPC or other high-current-consuming devices.

In some embodiments, the measuring block 910 includes a dividing circuit 912, delaying circuits 913, 991, a measuring device 930, a controlling circuit 915, a multiplexer MX9 and an inverter Z91. The feedback block 920 includes a detecting circuit 914, a gating circuit 916, an inverter Z92 and a NAND logic gate D9.

Referring to FIG. 1 and FIG. 9A, the system 900A is an embodiment of the system 100. The controlling circuit 915 corresponds to the controlling circuit 115. The processing device 940, the measuring device 930, the signal generating circuit 911, the dividing circuit 912, the delaying circuit 913, the detecting circuit 914 and the gating circuit 916 correspond to the processing device 120, the measuring device 130, the signal generating circuit 111, the dividing circuit 112, the delaying circuit 113, the detecting circuit 114 and the gating circuit 116, respectively. Therefore, some descriptions are not repeated for brevity.

As illustratively shown in FIG. 9A, the processing device 940 is configured to be turned on or off according to a gated clock signal GCLK9, and is configured to generate a voltage difference VDF9. In some embodiments, the processing device 940 is configured to be turned on or off to generate a current difference, and configured to generate the voltage difference VDF9 according to the current difference.

As illustratively shown in FIG. 9A, the signal generating circuit 911 is configured to generate a clock signal CLK9. The inverter Z91 is configured to invert the clock signal CLK9 to generate a clock signal CK91. The multiplexer MX9 is configured to select one of the clock signals CK91 and CLK9 according to a selecting signal CS91, to generate a clock signal CK92. The dividing circuit 912 is configured to divide a frequency of the clock signal CK92 to generate an enable signal SC91. In some embodiments, the controlling circuit 915 is configured to generate the selecting signal CS91. In some embodiments, the clock signal CLK9 corresponds to a 4.5 GHz frequency domain.

As illustratively shown in FIG. 9A, the controlling circuit 915 is configured to generate an enable signal SC92 according to the enable signal SC91. The delaying circuit 913 is configured to delay the enable signal SC92 according to a controlling signal DY9, to generate an enable signal SD91. In some embodiments, the enable signal SC92 corresponds to a 280 MHz frequency domain. In some embodiments, the controlling circuit 915 is configured to adjust the frequency domain of the enable signal SC91 to generate the enable signal SC92. In some embodiments, the controlling circuit 915 includes buffers (not shown in FIG. 9A) configured to delay the enable signal SC91 to generate the enable signal SC92.

As illustratively shown in FIG. 9A, the inverter Z92 is configured to invert the enable signal SD91 to generate an enable signal SD92. The detecting circuit 114 is configured to generate a feedback signal PD9 according to the clock signal CLK9 and the enable signal SD92. The controlling circuit 915 is configured to generate the controlling signal DY9 according to the feedback signal PD9.

As illustratively shown in FIG. 9A, the NAND gate D9 is configured to generate an enable signal SD93 according to a selecting signal SS9 and the enable signal SD91. The gating circuit 916 is configured to generate a gated clock signal GCLK according to the clock signal CLK and the enable signal SD93, and is configured to apply the gated clock signal GCLK to the controlling circuit 915.

As illustratively shown in FIG. 9A, the delaying circuit 991 is configured to delay a voltage signal VF91 of the controlling circuit 915 to generate a voltage signal VF92, and apply the voltage signal VF92 to the measuring device 930. In some embodiments, the delaying circuit 991 is configured to operate according to a digital or analog signal (not shown in FIG. 9A). In some embodiments, the voltage signals VF91 and VF92 are clock signals.

As illustratively shown in FIG. 9A, the measuring device 930 is configured to extract an impedance of a power delivery network (not shown in FIG. 9A), which provides reference voltage signals to the processing device 940, according to the voltage difference VDF9. In some embodiments, the measuring device 930 is further configured to generate a signal SMP with the information of the impedance, and provide the signal SMP to the controlling circuit 915.

In some embodiments, the selecting signal SS9 is configured for select modes of the system 900. When the selecting signal SS9 has the logic value of 1, the gating circuit 916 is triggered by an edge of the enabled signal SD93 to generate the gated clock signal GCLK9.

When the selecting signal SS9 has the logic value of 0, a voltage level of the enabled signal SD93 does not change, and the gating circuit 916 is not triggered by the enabled signal SD93. Accordingly, the gated clock signal GCLK9 does not oscillate. When the gated clock signal GCLK9 does not oscillate, the processing device 940 does not generate the voltage difference VDF9.

Referring to FIG. 9A and FIG. 1, operations, such as the operations OP41-OP45 and SP41-SP412 shown in FIG. 4A and FIG. 4B, performed with the signals of the system 900A and the signals of the system 100 are similar. The clock signals CLK9, CK91 and CK92 correspond to the clock signal CLK. The enable signals SC91 and SC92 correspond to the enable signal SCLK. The enable signals SD91, SD92 and SD93 correspond to the enable signal SCD. The feedback signal PD9 corresponds to the feedback signal PD. The controlling signal DY9 corresponds to the controlling signal DLY. The gated clock signal GCLK9 corresponds to the gated clock signal GCLK. The voltage difference VDF9 corresponds to the voltage difference VDF. Therefore, some descriptions are not repeated for brevity.

Figure 9B:
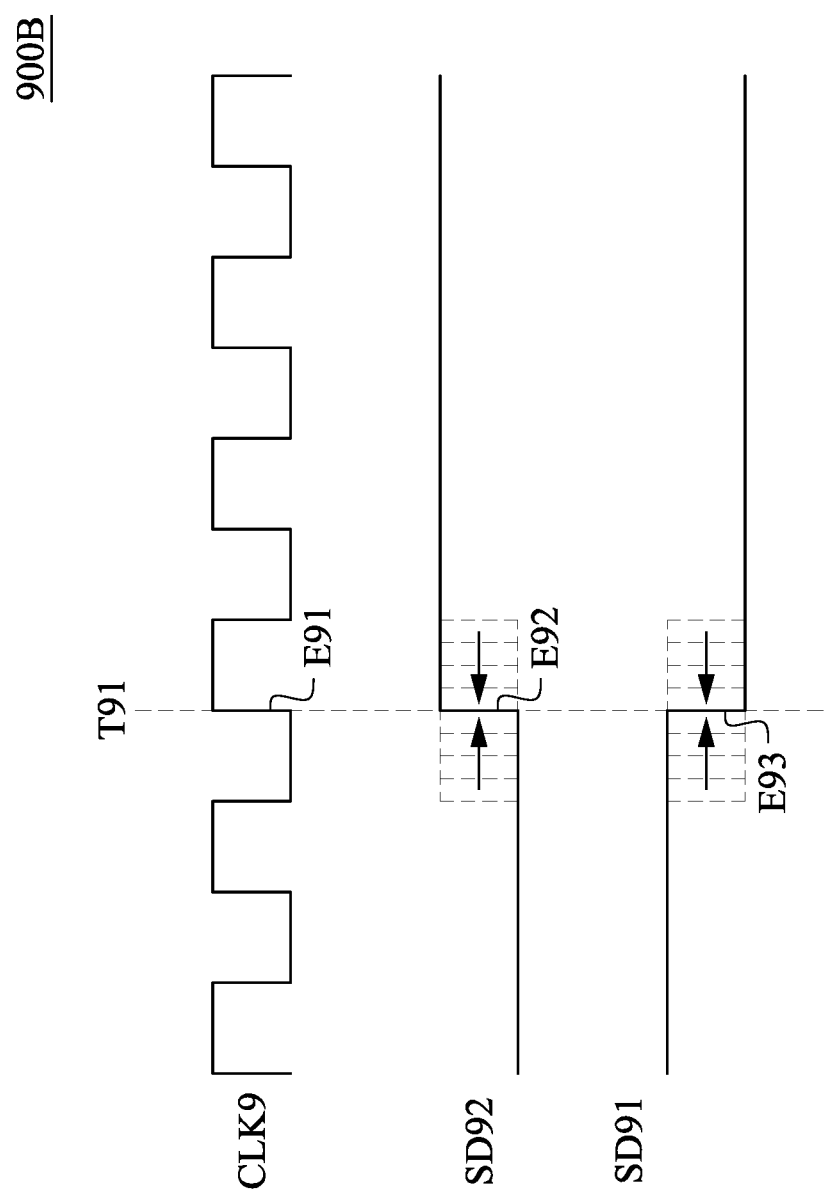
FIG. 9B is a timing diagram associated with operations of the system shown in FIG. 9A, in accordance with some embodiments of the present disclosure.

FIG. 9B is a timing diagram 900B of the system 900A shown in FIG. 9A aligning the enable signals SD91 and SD92 with the clock signal CLK9, in accordance with some embodiments of the present disclosure. As illustratively shown in FIG. 9B, a rising edge E91 of the clock signal CLK9, a rising edge E92 of the enable signal SD92 and a falling edge E93 of the enable signal SD91 are aligned with each other.

Referring to FIG. 9B, FIG. 9A and FIG. 4B, when the edges E92 and E93 are not aligned with the edge E91, the system 900A is configured to perform at least a part of the method 400B, to adjust a delay time period of the enable signal SD91, until the edges E92 and E93 are aligned with the edge E91.

Also disclosed is a system. The system includes a measuring device, a processing device and a signal generating device. The measuring device is configured to measure a voltage difference between a first node and a second node. The processing device is coupled between the first node and the second node. The signal generating device is configured to provide a first clock signal to the processing device to adjust the voltage difference, configured to generate the first clock signal according to a first enable signal and a second clock signal, and configured to align an edge of the first enable signal with an edge of the second clock signal.

Also disclosed is a method. The method includes: delaying, by a delaying circuit, a first enable signal by a first delay time period to generate a second enable signal; generating, by a detecting circuit, a feedback signal according to a voltage level of a first clock signal at a moment of an edge of the second enable signal; and adjusting, by a controlling circuit, the first delay time period according to the feedback signal, until the edge of the second enable signal is aligned with an edge of the first clock signal.

Also disclosed is a device. The device includes a dividing circuit, a delaying circuit, a gating circuit and a detecting circuit. The dividing circuit is configured to divide a first clock signal to generate a first enable signal. The delaying circuit is configured to delay the first enable signal according to a feedback signal, to generate a second enable signal. The gating circuit is configured to receive the second enable signal and be triggered by the first clock signal. The detecting circuit is configured to receive the first clock signal and be triggered by the second enable signal, to generate the feedback signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
   a measuring device configured to measure a voltage difference between a first node and a second node;
   a processing device coupled between the first node and the second node; and
   a signal generating device configured to provide a first clock signal to the processing device to adjust the voltage difference, configured to generate the first clock signal according to a first enable signal and a second clock signal, and configured to align an edge of the first enable signal with an edge of the second clock signal.

2. The system of claim 1, wherein the signal generating device comprises:
   a delaying circuit configured to adjust the first enable signal according to a voltage level of the second clock signal at a moment of the edge of the first enable signal.

3. The system of claim 2, wherein the signal generating device further comprises:
   a dividing circuit configured to divide a frequency of the second clock signal, to generate a second enable signal, wherein the delaying circuit is further configured to delay the second enable signal according to the voltage level to generate the first enable signal.

4. The system of claim 1, wherein the signal generating device is further configured to adjust the first enable signal according to a feedback signal, and
   the signal generating device comprises:
   a detecting circuit configured detect a voltage level of the second clock signal at a moment of the edge of the first enable signal, to generate the feedback signal corresponding to the voltage level.

5. The system of claim 4, wherein the detecting circuit comprises:
   a flip flop configured to be triggered by the edge of the first enable signal to generate the feedback signal corresponding to the voltage level.

6. The system of claim 1, wherein the signal generating device further comprises:
   a controlling circuit configured to compare a voltage level of the second clock signal at a moment of the edge of the first enable signal with a first voltage threshold level, and configured to delay the edge of the first enable signal when the voltage level does not meet the first threshold voltage level.

7. The system of claim 6, wherein the controlling circuit is further configured to accumulate logic values corresponding to the voltage level,
   in response to the voltage level has a first voltage level, each of the logic values has a first value,
   in response to the voltage level has a second voltage level, each of the logic values has a second value, and
   in response to the voltage level has a third voltage level between the first voltage level and the second voltage level, each of a first part of the logic values has the first value, and each of a second part of the logic values has the second value.

8. The system of claim 6, wherein the controlling circuit is further configured to delay the edge of the first enable signal until the voltage level is higher than the first threshold voltage level.

9. The system of claim 8, wherein the controlling circuit is further configured to delay the edge of the first enable signal until the voltage level is lower than a second threshold voltage level which is lower than the first threshold voltage level, before the voltage level is higher than the first threshold voltage level.

10. The system of claim 6, wherein the signal generating device comprises:
    a plurality of delaying units configured to be turned on in order until the voltage level meets the first threshold voltage level, each of the plurality of delaying units being configured to delay the first enable signal when turned on.

11. A method, comprising:
    delaying, by a delaying circuit, a first enable signal by a first delay time period to generate a second enable signal;
    generating, by a detecting circuit, a feedback signal according to a voltage level of a first clock signal at a moment of an edge of the second enable signal; and
    adjusting, by a controlling circuit, the first delay time period according to the feedback signal, until the edge of the second enable signal is aligned with an edge of the first clock signal.

12. The method of claim 11, further comprising:
generating a second clock signal according to the second enable signal and the first clock signal;
applying the second clock signal to adjust a voltage difference; and
measuring the voltage difference when the second clock signal oscillates.

13. The method of claim 11, wherein adjusting the first delay time period comprises:
sensing the feedback signal to generate a plurality of first logic values;
accumulate the plurality of first logic values to generate an accumulated value;
comparing the accumulated value with a first threshold value;
in response to the accumulated value being larger than the first threshold value, increasing the first delay time period by a second delay time period; and
after increasing the first delay time period by the second delay time period, resetting the accumulated value.

14. The method of claim 13, wherein adjusting the first delay time period further comprises:
after increasing the first delay time period by the second delay time period, in response to the accumulated value being larger than the first threshold value, increasing the first delay time period by the second delay time period.

15. The method of claim 13, wherein adjusting the first delay time period further comprises:
after the accumulated value being smaller than or equal to the first threshold value, sensing the feedback signal to generate a plurality of second logic values;
accumulate the plurality of second logic values to generate the accumulated value;
comparing the accumulated value with a second threshold value larger than the first threshold value; and
in response to the accumulated value being smaller than the second threshold value, increasing the first delay time period by the second delay time period.

16. A device, comprising:
a dividing circuit configured to divide a first clock signal to generate a first enable signal;
a delaying circuit configured to delay the first enable signal according to a feedback signal, to generate a second enable signal;
a gating circuit configured to receive the second enable signal and be triggered by the first clock signal; and
a detecting circuit configured to receive the first clock signal and be triggered by the second enable signal, to generate the feedback signal.

17. The device of claim 16, further comprising:
a controlling circuit configured to accumulate logic values of the feedback signal to generate a controlling signal,
wherein the delaying circuit is further configured to adjust the second enable signal according to the controlling signal.

18. The device of claim 17, wherein the delaying circuit comprises:
a first delaying unit configured to increase a delay time period between the second enable signal and the first enable signal, when an accumulated value accumulated from the logic values is larger than a first threshold value; and
a second delaying unit configured to increase the delay time period, when the accumulated value is larger than the first threshold value, after the delay time period is increased by the first delaying unit.

19. The device of claim 18, wherein the delaying circuit further comprises:
a third delaying unit configured to increase the delay time period, when the accumulated value is smaller than a second threshold value larger than the first threshold value, after the delay time period is increased by the second delaying unit.

20. The device of claim 17, further comprising:
a logic circuit configured to control the gating circuit according to a selecting signal,
wherein the gating circuit is further configured to provide a second clock signal to the controlling circuit,
in response to the selecting signal having a first logic value, the second clock signal oscillates, and
in response to the selecting signal having a second logic value different from the first logic value, the second clock signal does not oscillate.

* * * * *